(12) United States Patent
Jang et al.

(10) Patent No.: US 7,563,683 B2
(45) Date of Patent: Jul. 21, 2009

(54) TRANSISTOR AND METHOD OF FABRICATING THE SAME

(75) Inventors: Young-Chul Jang, Gyeonggi-do (KR); Won-Seok Cho, Gyeonggi-do (KR); Soon-Moon Jung, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 417 days.

(21) Appl. No.: 11/611,719

(22) Filed: Dec. 15, 2006

(65) Prior Publication Data

US 2007/0087491 A1 Apr. 19, 2007

Related U.S. Application Data

(62) Division of application No. 10/977,036, filed on Oct. 28, 2004, now Pat. No. 7,170,133.

(30) Foreign Application Priority Data

Nov. 24, 2003 (KR) ............................... 2003-83785

(51) Int. Cl.
*H01L 21/336* (2006.01)
(52) U.S. Cl. ............................... 438/296; 257/E21.655
(58) Field of Classification Search .................. 438/296, 438/437; 257/E21.655
See application file for complete search history.

(56) References Cited

U.S. PATENT DOCUMENTS 5,492,858 A * 2/1996 Bose et al. .................. 438/437
5,753,951 A 5/1998 Geissler (Continued)

FOREIGN PATENT DOCUMENTS

JP 60-261171 12/1985

(Continued)

OTHER PUBLICATIONS

English language abstract of Japanese Publication No. 60-261171.

(Continued)

*Primary Examiner*—Chandra Chaudhari
(74) *Attorney, Agent, or Firm*—Marger Johnson & McCollom, P.C.

(57) ABSTRACT

Disclosed is a method for fabricating a gate of a field effect transistor. The method comprises a) forming a field oxide layer on a silicon substrate and then applying a photoresist layer in order to define a gate, b) etching the silicon substrate using the photoresist layer as a mask, c) sequentially depositing a gate oxide layer and a gate polysilicon layer on an entire surface of the silicon substrate and defining the gate using the photoresist layer, d) etching the resulting silicon substrate using the photoresist layer as a mask to form the gate and forming an $N^-$ ion region by means of ion implantation, and e) depositing and etching back an oxide layer to form a sidewall oxide layer and forming an $N^+$ ion region by means of ion implantation. Consequently, the gate is made by etching the silicon substrate. Thus, a length of the gate is reduced, so that it is possible not only to make a cell area smaller but also to prevent a short-channel effect.

17 Claims, 6 Drawing Sheets

U.S. PATENT DOCUMENTS

| | | | |
|---|---|---|---|
| 5,880,007 A * | 3/1999 | Varian et al. | 438/427 |
| 6,548,859 B2 | 4/2003 | Maegawa | |
| 6,583,025 B2 | 6/2003 | Hong | |
| 2002/0053711 A1 | 5/2002 | Chau et al. | |
| 2003/0085434 A1 | 5/2003 | Yoshida et al. | |

FOREIGN PATENT DOCUMENTS

| | | |
|---|---|---|
| KR | 1994-0001450 | 1/1994 |

OTHER PUBLICATIONS

English language abstract of Korean Publication No. 1994-0001450.

\* cited by examiner

TRANSISTOR AND METHOD OF FABRICATING THE SAME

CROSS-REFERENCE TO RELATED APPLICATION

This application is a divisional of U.S. patent application Ser. No. 10/977,036, filed on Oct. 28, 2004, now pending, which claims priority from Korean Patent Application No. 2003-83785, filed on Nov. 24, 2003, the disclosures of which are incorporated herein by reference in their entirety.

BACKGROUND

1. Technical Field

The present invention relates to semiconductor devices and to a method of manufacturing the same, and more particularly, to transistors and to a method of manufacturing the same.

2. Discussion of the Related Art

MOS field effect transistors (hereinafter, referred to as MOS transistors) are widely used in semiconductor devices. High speed devices such as static random access memories and dynamic random access memories (DRAM) generally include MOS transistors. In order to improve the speed of such devices, it is desirable to increase the drive current passing through the channel of the MOS transistors in the devices.

The amount of drive current that can pass through the channel of a MOS transistor is proportional to the channel width and inversely proportional to the channel length. In general, when the size of the cells in a semiconductor memory is reduced, the size of the MOS transistor inside the cell is reduced. When the size of the transistor is reduced, the channel length of the MOS transistor is also reduced. This reduction can help improve the drive current. However, a reduction of the channel length can also have negative effects such as a hot carrier effect. In order to avoid such negative effects, it is desirable to improve the drive current capability of MOS transistors by an increase in the channel width.

FIG. 1 is a sectional view illustrating a conventional MOS transistor taken along the direction of channel width. FIG. 1 shows a typical MOS transistor having a flat-shaped active region 100. If the channel width W is extended with a flat-shape, the drive current of the MOS transistor can be improved. However, the amount of space used by the MOS transistor is increased. Such an increase is not helpful with respect to the high-integration of the semiconductor device. It is noted that the reference numeral "102," refers to the gate electrode of the device.

A MOS transistor having a trench in an active region, and a method of fabricating the same are disclosed in US Patent Publication No. 2003-0085434. According to the US Patent Publication No. 2003-0085434, an isolation layer defining an active region is disposed inside a semiconductor substrate. The active region has at least one trench displaced across a gate electrode. Such a MOS transistor has an effective channel width that extends as long as the length of both sidewalls of the trench. However, when manufacturing a MOS transistor by the method disclosed in the US Patent Publication No. 2003-0085434, an additional photolithography process is necessary to form the trench. Thus, the processes become more complicated. Further, limitations in pattern resolution of the photolithography process makes it more difficult to achieve high integration.

SUMMARY OF THE INVENTION

One object of the present invention is to provide a transistor having a high effective channel width in order to improve the operation speed of a transistor.

Another object of the present invention is to provide a method of manufacturing a transistor, which is simplified and which does not require an additional photolithography process, thus, reducing production costs.

The present invention provides a transistor having an active region with mesa structure. The transistor includes an isolation layer disposed on a semiconductor substrate to define an active region. A pair of source/drain regions are disposed in the active region. The source/drain regions are spaced apart from each other, and a channel region is interposed between the source/drain regions. The active region has a mesa disposed across the channel region, which extends to the source/drain regions. A gate electrode is disposed to cross over the active region along the direction which is across the mesa. Thus, the transistor has a high effective channel width.

The present invention also provides a method of fabricating a transistor such as that described as above. The method includes forming an isolation trench defining an active region in a semiconductor substrate. An isolation hard mask pattern remains on the active region. The isolation hard mask pattern is isotropically etched to expose a boundary portion of the active region. This forms a mesa hard mask pattern on a central portion of the active region, and concurrently forms an extended opening defined by the mesa hard mask pattern. A buried insulating layer is formed to fill the isolation trench and the extended opening. Then, by removing the buried insulating layer of the extended opening, the boundary portion of the active region is exposed. Concurrently, a buried insulating layer pattern inside the isolation trench is formed. The exposed boundary portion of the active region is anisotropically etched using the buried insulating layer pattern and the mesa hard mask pattern as etch masks. This forms a mesa in the active region. The mesa hard mask pattern and the upper portion of the buried insulating layer pattern are removed. A gate electrode is formed to cross over the active region along the direction across the mesa.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
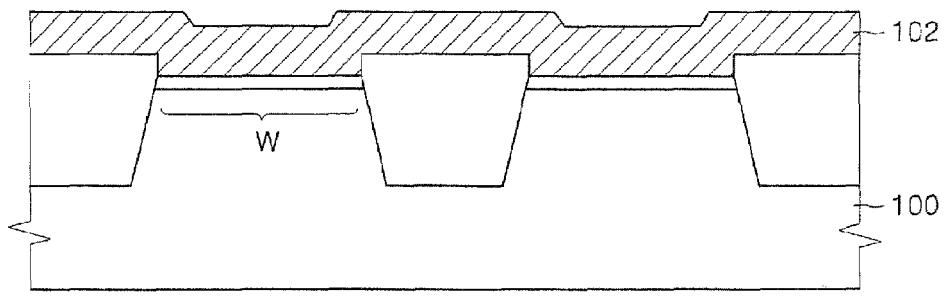
FIG. 1 is a sectional view illustrating a conventional MOS transistor taken along a direction of channel width.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will fully convey the scope of the invention to those skilled in the art. In the drawings, the thickness of layers and regions are exaggerated for clarity. Like numbers refer to like elements throughout the specification.

Figure 2:
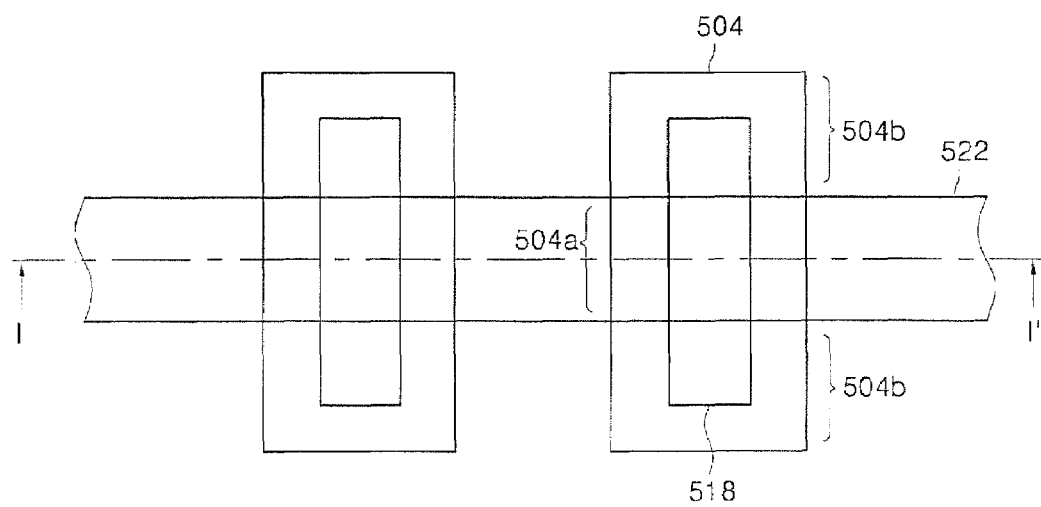
FIG. 2 is a top plan view of a MOS transistor according to one embodiment of the present invention.
Figure 3:
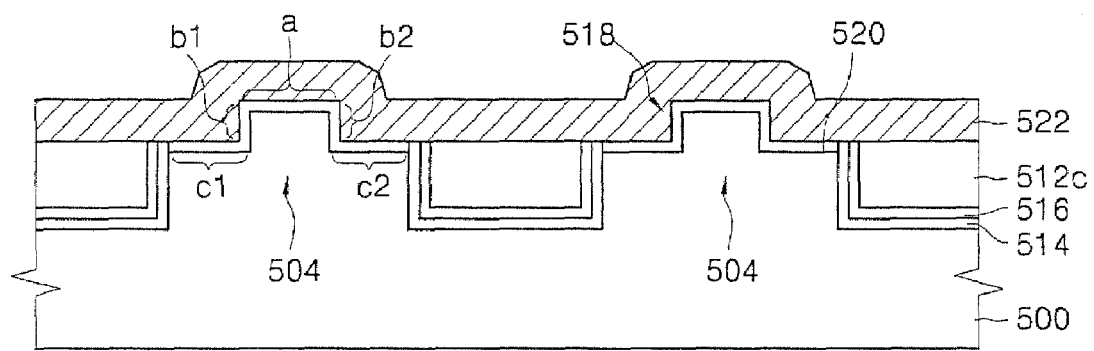
FIG. 3 is a sectional view illustrating the MOS transistor according to one embodiment of the present invention taken along the line I-I' of FIG. 2.

FIG. 2 is a top plan view of a MOS transistor according to one embodiment of the present invention, and FIG. 3 is a sectional view taken along line I-I' of FIG. 2.

Referring to FIGS. 2 and 3, an isolation layer 512c is disposed in a semiconductor substrate 500. The isolation layer 512c may be, for example, a HDP oxide layer. An active region 504 is defined by the isolation layer 512c. Further, sequentially from the surface of the semiconductor substrate 500, a sidewall oxide layer 514 and a liner insulating layer 516 may be interposed between the semiconductor substrate 500 and the isolation layer 512c. The sidewall oxide layer 514 may be a thermal oxide layer. The liner insulating layer 516 may be a silicon nitride layer. A pair of source/drain regions 504b may be disposed in the active region 504, with spaced apart from each other. Further, a channel region 504a is disposed between a pair of the source/drain regions 504b. A mesa 518 is disposed across the channel region 504a with straight extended to the source/drain regions 504b. As such, the channel region 504a has a protrusion structure, which includes a top surface of the mesa 518, sidewalls b1, b2 of the mesa 518, and surfaces c1, c2 of the active region on both sides of the mesa 518. A gate electrode 522 is disposed to cross over the channel region 504a along the direction across the mesa 518. The gate electrode 522 may be formed of polysilicon. A gate insulating layer 520 is interposed at least between the semiconductor substrate of the active region 504 and the gate electrode 522. The gate insulating layer 520 may be a thermal oxide layer.

As described above, in one exemplary embodiment of the present invention, the channel region 504a of the MOS transistor may include a mesa 518, which is disposed along the direction across the gate electrode 522. As a result, the MOS transistor of the present invention may have an effective channel width corresponding to a width of the top surface a of the mesa 518, a height of the sidewalls b1, b2 of the mesa 518, and a width of the surfaces c1, c2 of active region on both side of the mesa 518. That is, the MOS transistor of the present invention has an effective channel width that includes height of the sidewalls b1, b2 of the mesa 518. This is in comparison to a conventional MOS transistor that has a flat active region.

FIGS. 4 to 11 are sectional views illustrating a method of fabricating the MOS transistor according to one embodiment of the present invention. FIGS. 4 to 11 are taken along the line I-I' of FIG. 2.

Figure 4:
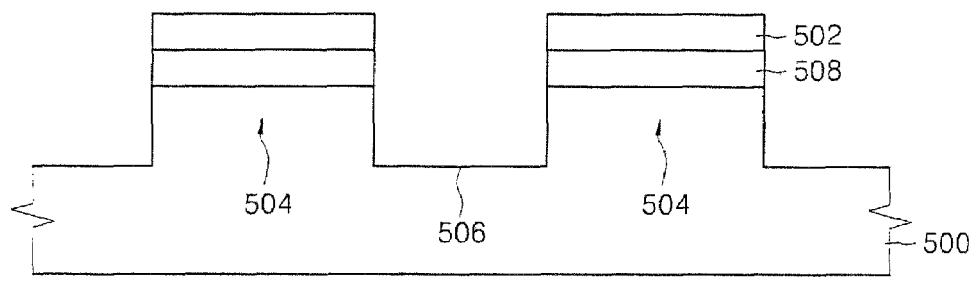
FIGS. 4 to 11 are sectional views illustrating a method of fabricating the MOS transistor according to one embodiment of the present invention taken along the line I-I' of FIG. 2.

Referring to FIGS. 2 and 4, a hard mask layer is formed on the whole surface of a semiconductor substrate 500. Preferably, before the hard mask layer is formed, a pad oxide layer may be formed on the whole surface of the semiconductor substrate 500. The hard mask layer may be a silicon nitride layer. The pad oxide layer may be a thermal oxide layer. Then, a photoresist pattern 502 is formed on the hard mask layer with openings at predetermined positions in the hard mask layer. The hard mask layer is anisotropically etched using the photoresist pattern 502 as an etch mask, and the semiconductor substrate 500 is anisotropically etched, so as to form an isolation trench 506 defining an active region 504 in the semiconductor substrate 500. An isolation hard mask pattern 508 is formed and non-etched. It remains on the active region 504. The isolation trench 506 preferably has a depth of at least 4000 Å.

Figure 5:
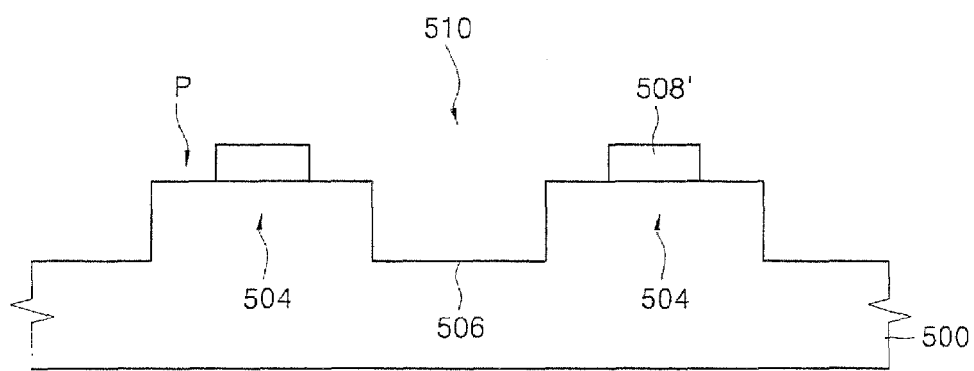

Referring to FIGS. 2 and 5, the photoresist pattern 502 is removed. Then, an isotropic etch is performed on the isolation hard mask pattern 508 remaining on the active region 504. The isotropic etch may be a wet etch using, for example, phosphoric acid as an etching solution. The isotropic etch is performed until the isolation hard mask pattern 508 is reduced in size to have an appropriate width. As a result, the isolation hard mask pattern 508 on the boundary region of the active region 504 (hereinafter, referred to as boundary portion P) is removed, so as to expose a boundary portion P. Further, there a mesa hard mask pattern 508' is formed and it remains on the central portion of the active region 504 defined by the exposed boundary portion P. The mesa hard mask pattern 508' is the pattern to which the isolation hard mask pattern 508 is reduced by the isotropic etch. Further, over the isolation trench 506, an extended opening 510 is defined by the mesa hard mask pattern 508.'

Figure 6:
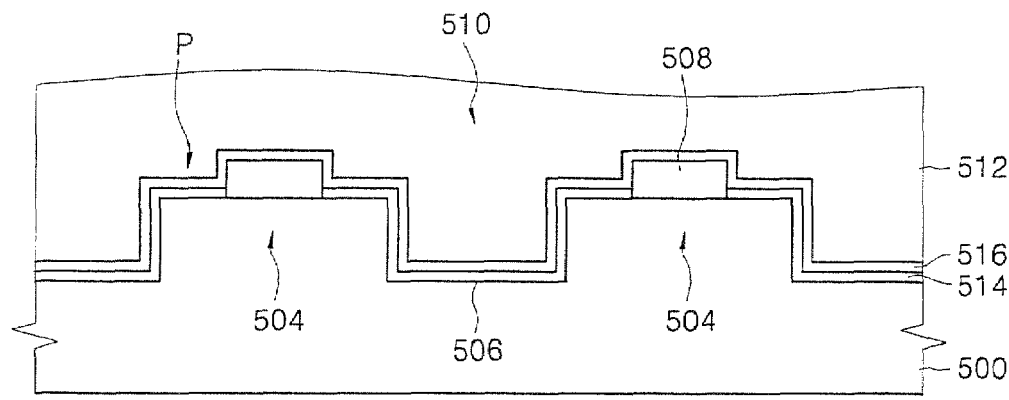

Referring to FIGS. 2 and 6, an insulating layer 512 is formed to fill the isolation trench 506 and the extended opening 510 on the whole surface of the semiconductor substrate that has the mesa hard mask pattern 510. The insulating layer 512 may be formed of a HDP oxide layer. Preferably, before the insulating layer 512 is formed, a sidewall oxide layer 514 and a liner insulating layer 516 may be formed conformally and sequentially at least on the inner surface of the isolation trench 506 and on the boundary portion P. The sidewall oxide layer 514 is formed to cure any etch damage on the semiconductor substrate 500 due to high energy of ions during etching of the isolation trench 506. The sidewall oxide layer 514 may be a thermal oxide layer. The liner insulating layer 516 is formed to prevent further oxidization of the semiconductor substrate 500 around the isolation trench 506 by a following thermal process. The liner insulating layer 516 may be a silicon nitride layer.

Figure 7:
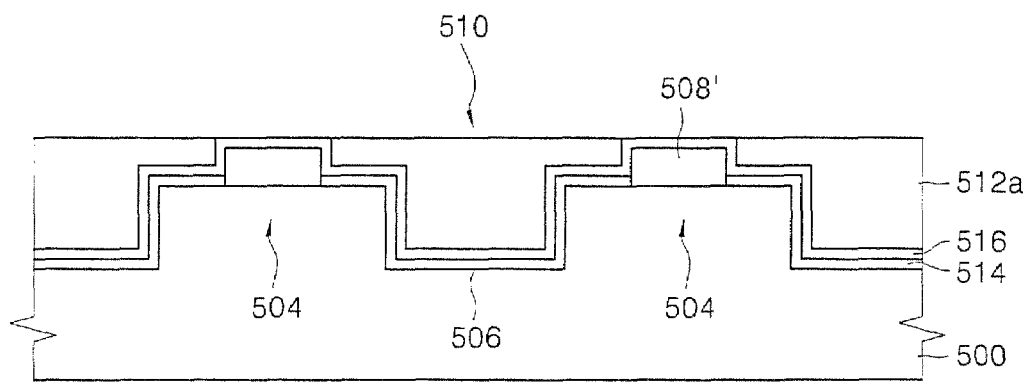

Referring to FIGS. 2 and 7, the insulating layer 512 is planarized to expose the mesa hard mask pattern 508' or the liner insulating layer 514 on the mesa hard mask pattern 508.' As a result, there is a buried insulating layer 512a filling the isolation trench 506 and the extended opening 510. The planarization of the insulating layer 512 can be performed by using CMP process.

Figure 8:
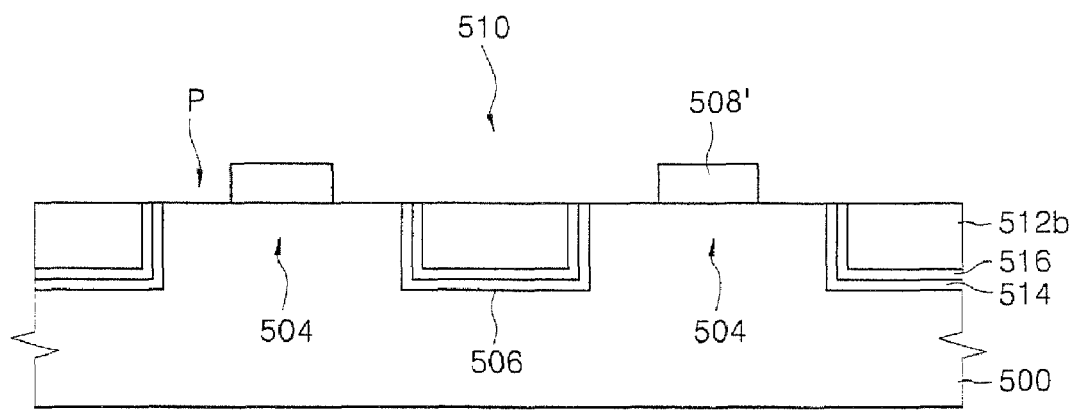

Referring to FIGS. 2 and 8, the buried insulating layer 512a of the extended opening 510 is removed to expose the boundary portion P. At the same time, a buried insulating layer pattern 512b is formed on the inside the isolation trench 506. The buried insulating layer 512a inside the extended opening 510 can be removed through a selective wet etch using an etching solution having a high selectivity with respect to the silicon oxide layer. As described above, if the sidewall oxide layer 514 and the liner insulating layer 516 are formed on the boundary portion P, after the buried insulating layer 512a on the extended opening 510 is removed, additional wet etch is performed to sequentially remove the sidewall oxide layer 514 and the liner insulating layer 516 in the boundary portion P. Further, the liner insulating layer 516 on the mesa hard mask pattern 508' can be also removed.

Figure 9:
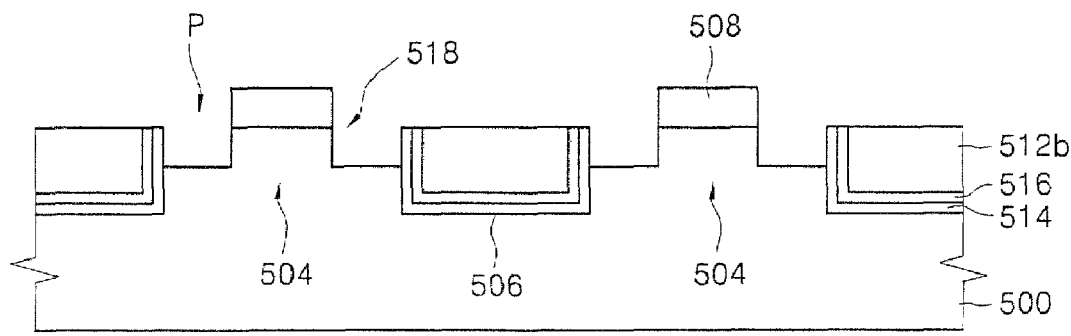

Referring to FIGS. 2 and 9, after exposing the boundary portion P, by using the mesa hard mask pattern 508' and the buried insulating layer pattern 512b as etch masks, the boundary portion P is isotropically etched and made recessed. As a result, mesa 518 is formed in the active region 504. During the process, an upper side of the buried insulating layer pattern 512b can be partially recessed. Further, as described above, in the case where the sidewall oxide layer 514 and the liner insulating layer 516 are formed, upper portions of the sidewall oxide layer 514 and the liner insulating layer 516 may be exposed over the surface of the semiconductor substrate in the recessed boundary portion P.

Figure 10:
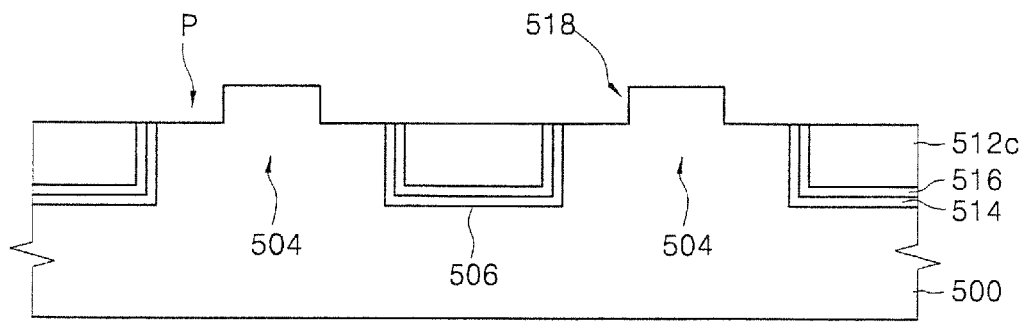

Referring to FIGS. 2 and 10, after the mesa 518 is formed, the mesa hard mask pattern 508' is removed. Further, the buried insulating layer pattern 512b is recessed to form an isolation layer 512c on the inside of the isolation trench 506. In this embodiment of the present invention the mesa hard mask pattern 508' may be a silicon nitride layer, and the buried insulating layer pattern 512a may be a silicon oxide layer by HDP. Thus, the removal of the mesa hard mask pattern 508' and the recess of the upper portion of the buried insulating layer pattern 512b can be performed by wet etch using separate etching solutions.

However, by using an etching solution having an appropriate selectivity with respect to the silicon nitride layer and the silicon oxide layer, the removal of the mesa hard mask pattern 508' and the recess of the buried insulating layer pattern 512b can be performed at the same time.

Further, in the case where the sidewall oxide layer 514 and the liner insulating layer 516 are formed, the upper portions of the sidewall oxide layer 514 and the liner insulating layer 516, which are exposed over the surface of the semiconductor substrate in the recessed boundary portion P, are also etched during the process. Further, the buried insulating layer pattern 512b is preferably recessed to an extent that a tilt ion implantation process is possible on the sidewall of the mesa 518 during a following impurity ion implantation process used to control the threshold voltage.

Figure 11:
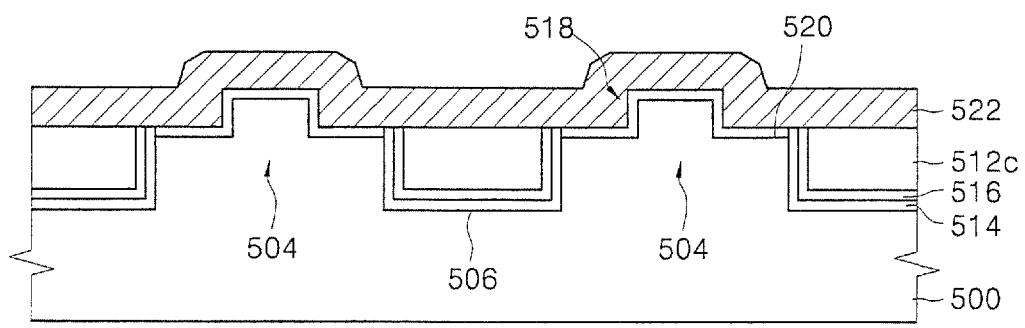

Referring to FIGS. 2 and 11, after the mesa hard mask pattern 508' is removed, and an isolation layer 512c is formed inside the isolation trench 506, an impurity ion implantation process for controlling a threshold voltage is performed in a normal manner. Then, a gate insulating layer 520 is formed on the active region 504. The gate insulating layer 520 may be a thermal oxide layer. A conformal conductive layer is formed on the whole surface of the semiconductor substrate 500 having the gate insulating layer 520. The conductive layer may be a polysilicon layer. Then, by patterning the conductive layer, a gate electrode 522 is formed across the active region 504. The gate electrode 522 is formed to cross over the active region 504 along the direction across the mesa 518. As a result, the MOS transistor has a channel width corresponding to a width of the top surface of the mesa 518, a height of the sidewalls of the mesa 518, and a width of the surfaces of the active region on both side of the mesa.

Then, impurity ions are implanted into the semiconductor substrate by using the gate 25 electrode 522 as an ion implantation mask, so as to form source/drain regions 504b inside the active region adjacent to both sides of the gate electrode 522. Further, a channel region 504a is defined. The channel region 504a is interposed between the source/drain regions 504b and overlapping the gate electrode 522.

Therefore, in accordance with the present invention, a channel width is increased by the mesa disposed in the active region of the transistor. As a result, there can be an increase in the drive current passing the channel of the transistor, and also, the operation speed of the transistor is increased. Further, this can be done without any additional photolithography process. The production cost is reduced, and the resulting transistor effectively has an extended channel width produced by a simple processes.

While the invention has been shown and described with respect to preferred embodiments thereof, it should be understood that various other changes in form and detail may be made without departing from the spirit and scope of the invention. The scope of the invention is defined and limited only by the appended claims.

What is claimed is:

1. A method of fabricating a transistor comprising:

forming an isolation trench defining an active region in a semiconductor substrate while allowing an isolation hard mask pattern to remain on the active region;

isotropically etching the isolation hard mask pattern to expose a boundary portion of said active region, to form a mesa hard mask pattern on a central portion of the active region, and to concurrently form an extended opening defined by the mesa hard mask pattern over the isolation trench;

forming a buried insulating layer to fill the isolation trench and the extended opening;

removing the buried insulating layer to expose the boundary portion of the active region, and concurrently to form a buried insulating layer pattern on the inside of the isolation trench;

anisotropically etching the exposed boundary portion of the active region by using the buried insulating layer pattern and the protrusion hard mask pattern as etch masks to form a mesa in the active region;

removing the overall mesa hard mask pattern and the upper portion of the buried insulating layer pattern; and forming a gate electrode to cross over the active region along the direction across the mesa.

2. The method of fabricating a transistor according to claim 1, wherein forming the isolation trench and the isolation hard mask pattern comprises:

forming a hard mask layer on the whole surface of the semiconductor substrate;

forming a photoresist pattern on the hard mask layer;

subsequently etching the hard mask and the semiconductor substrate using the photoresist pattern as an etch mask to form an isolation trench in the semiconductor substrate; and removing the photoresist pattern.

3. The method of fabricating a transistor according to claim 1, wherein the isolation hard mask pattern is a silicon nitride layer.

4. The method of fabricating a transistor according to claim 1, wherein forming the buried insulating layer comprises:

forming an insulating layer to fill the isolation trench and the extended opening on the whole surface of the semiconductor substrate having the isolation trench and the extended opening; and planarizing the insulating layer to expose the mesa hard mask pattern.

5. The method of fabricating a transistor according to claim 4, wherein the planarization of the insulating layer is performed by a CMP process.

6. The method of fabricating a transistor according to claim 1, wherein the buried insulating layer is a HDP oxide layer.

7. The method of fabricating a transistor according to claim 1, wherein removing the buried insulating layer of the extended opening is performed by using wet etch.

8. The method of fabricating a transistor according to claim 1, wherein removing the overall mesa hard mask pattern and the upper portion of the buried insulating layer pattern is separately performed by wet etch using separate etching solutions.

9. The method of fabricating a transistor according to claim 1, wherein removing the overall mesa hard mask pattern and the upper portion of the buried insulating layer pattern is performed at the same time by wet etch using an etching solution having a selectivity with respect to the mesa hard mask pattern and the buried insulating layer pattern.

10. The method of fabricating a transistor according to claim 1, wherein forming the gate electrode comprises:
conformally forming a gate insulating layer and a conductive layer sequentially on the semiconductor substrate having the mesa; and
patterning the conductive layer.

11. The method of fabricating a transistor according to claim 1, wherein the gate electrode is formed of polysilicon.

12. The method of fabricating a transistor according to claim 1, further comprising implanting impurity ions into the semiconductor substrate using the gate electrode as an ion implantation mask, so as to form source/drain regions in the active region adjacent to both sides of the gate electrode, and define the channel region disposed between the source/drain regions.

13. The method of fabricating a transistor according to claim 1, after forming the mesa hard mask pattern and the extended opening, the method further comprises conformally forming a sidewall oxide layer and a liner insulating layer sequentially on at least on the inner surface of the isolation trench and the boundary portion of the active region.

14. The method of fabricating a transistor according to claim 13, wherein the liner insulating layer is formed of a silicon nitride layer.

15. The method of fabricating a transistor according to claim 13, wherein exposing the boundary portion of the active region further comprises sequentially removing the liner insulating layer and the sidewall oxide layer on the boundary portion of the active region after removing the buried insulating layer of the extended opening.

16. The method of fabricating a transistor according to claim 15, wherein removing the liner insulating layer and the sidewall oxide layer comprises wet etch.

17. The method of fabricating a transistor according to claim 13, wherein removing the mesa hard mask pattern and the upper portion of the buried insulating layer further comprises removing the liner insulating layer and the sidewall oxide layer exposed during the anisotropic etch process for the formation of the mesa.

* * * * *

UNITED STATES PATENT AND TRADEMARK OFFICE
CERTIFICATE OF CORRECTION

PATENT NO. : 7,563,683 B2  Page 1 of 1
APPLICATION NO. : 11/611719
DATED : July 21, 2009
INVENTOR(S) : Young-Chul Jang et al.

It is certified that error appears in the above-identified patent and that said Letters Patent is hereby corrected as shown below:

Column 5, line 9, the word "invention" should read -- invention, --;
Column 5, line 50, the words "gate 25" should read -- gate --.

Signed and Sealed this

Sixth Day of October, 2009

David J. Kappos
*Director of the United States Patent and Trademark Office*